United States Patent [19]

Hartmann et al.

[11] Patent Number: 4,814,722

[45] Date of Patent: Mar. 21, 1989

[54] AMPLIFIER FOR TIMED ELECTRICAL MEASUREMENT SIGNALS

[75] Inventors: Hermann Hartmann, Harsum; Hanjürgen Frohböse, Bad Salsdetfurth, both of Fed. Rep. of Germany

[73] Assignee: Diessel GmbH & Co., Hildesheim, Fed. Rep. of Germany

[21] Appl. No.: 171,454

[22] Filed: Mar. 21, 1988

[30] Foreign Application Priority Data

Mar. 28, 1987 [DE] Fed. Rep. of Germany ....... 3710350

[51] Int. Cl.$^4$ ............................................. H03F 1/32
[52] U.S. Cl. .................................. 330/149; 307/353; 307/358
[58] Field of Search .................. 73/861.12, 861.13; 307/264, 353, 358, 520; 328/151, 165; 330/149

[56] References Cited

U.S. PATENT DOCUMENTS

| | | | |
|---|---|---|---|
| 3,878,715 | 4/1975 | Kobayashi | 73/861.13 X |
| 4,118,981 | 10/1978 | Cave | 73/861.13 |
| 4,406,988 | 9/1983 | Scholz | 307/358 X |
| 4,641,324 | 2/1987 | Karsh et al. | 328/151 X |

Primary Examiner—Steven Mottola
Attorney, Agent, or Firm—Gilbert L. Wells

[57] ABSTRACT

An amplifier for timed electrical measured signals loaded by a relatively high spurious DC voltage and fed to an analog-digital converter allows accurate measurement values using analog-digital converters of comparatively low resolution. The invention provides a signal superposed to consecutive and mutually opposite measured signals loaded with the spurious voltage that was obtained from the particular preceding signal relative to which it is inverted.

8 Claims, 2 Drawing Sheets

AMPLIFIER FOR TIMED ELECTRICAL MEASUREMENT SIGNALS

BACKGROUND OF THE INVENTION

The invention concerns an amplifier for timed electrical measurement signals on which is superposed a relatively high spurious DC voltage, ie noise, and which are fed to an analog-digital converter.

In known devices of this kind, illustratively magnetically-inductive flowmeters, optical sensors and the like, spurious voltages may arise. This is especially so for flowmeters wherein spurious DC voltages up to ±1 v may arise on account of contact potentials which then are superposed on the DC test signal proper. However as the DC signal is of a magnitude roughly from 10 to a maximum of 2,000 uv (microvolts), analyzing test signals with such noise will be difficult.

In particular such a device requires using an analog-digital converter of very high resolution. In turn, however, this high resolution renders such analog-digital converters very expensive, and such a transducer therefore will not be useful in many applications.

SUMMARY OF THE INVENTION

Accordingly it is the object of the invention to so design a device of the above stated kind which allows obtaining accurate measuremenet values while using an analog-digital converter of comparatively low resolution.

This problem is solved by the invention in that a signal is superposed to each of the consecutive, opposite sign measured signals with DC noise, said superposed signal being ascertained from the particular previous measurement signal and being inverted relative to it.

By this circuitry, a voltage value is added to the particular noisy measurement signal, where this value approximately corresponds to the voltage of this measurement signal, whereby the values of two consecutive measurement signals are compensated in such a way that the measuremenet signal is kept symmetric relative to null. The differences between consecutive measurement signals therefore form the actual measured value.

Accordingly the deviation caused by the noise voltage is compensated by the circuit of the invention, and as a result only the measurement signal is in essence fed to the digital converter. The advantage is obtained thereby that a relatively economical analog-digital converter with ordinary resolution up to 12 bits can be used. The saving is substantial, because such analog-digital converters are only 1% the cost of high-resolution converters. Moreover high-resolution analog-digital converters are much bulkier than those of ordinary resolution.

A compensating device is already known from the German Pat. No. 27 44 851 and U.S. Pat. Nos. 3,316,762 and 3,783,687 wherein compensation is achieved by separating the two half-cycles of a magnetic field by a pause in that field wherein the signal voltage is compensated to null; however such a system incurs the significant drawback that a loss of information takes place during that pause, whereby the measurement results, especially for measurement times, become inaccurate.

Appropriately this invention provides a switch-controlled analog memory to store the noisy measurement signal, on one hand to feed it to an addition node and on the other hand to feed it to two further switch-controlled analog memories from where it will be alternatingly fed once as a positive and once as a negative signal relative to the superposed noise voltage to an inverter which feeds the addition node. Accordingly these two memories serve to alternatingly store a positive and a negative measurement signal which are both then consecutively inverted by the inverter.

The switch controlled analog memories are the so-called "sample and hold" memories.

In this manner the particular preceding measurement signal is used to form an inverted signal which is combined at the addition node with the signal from the first memory and thereby the noise portion of the signal is compensated in the manner described above.

Appropriately the switches of the analog memories are driven from a common timer or clock, all three switches being interlinked, so that the switch timings are interrelated. In particular the switches of the second and third analog memories may be linked in such a way that one switch will be open when the other is closed, and vice versa. This assures that the signals from the two analog memories immediately link up.

The timer can be powered from line current, possibly with insertion of dividers or the like.

The switches may be semiconducting and known per se.

To limit the storage time, monostable vibrators (so-called "monoflops") may be mounted between the timer and the second and third analog memories, which control the storage times by means of time-limited pulses.

Moreover, the noise can be reduced in known manner by adding a capacitor circuitry (bootstrap circuit) to the signal generator, whereby the noise is reduced to about 1/10; this reduction however does not suffice to achieve adequately accurate measurement results.

BRIEF DESCRIPTION OF THE DRAWINGS

The invention is discussed comprehensively below in relation to an illustrative embodiment shown in the drawing.

DESCRIPTION OF THE PREFERRED EMBODIMENTS

Figure 1:
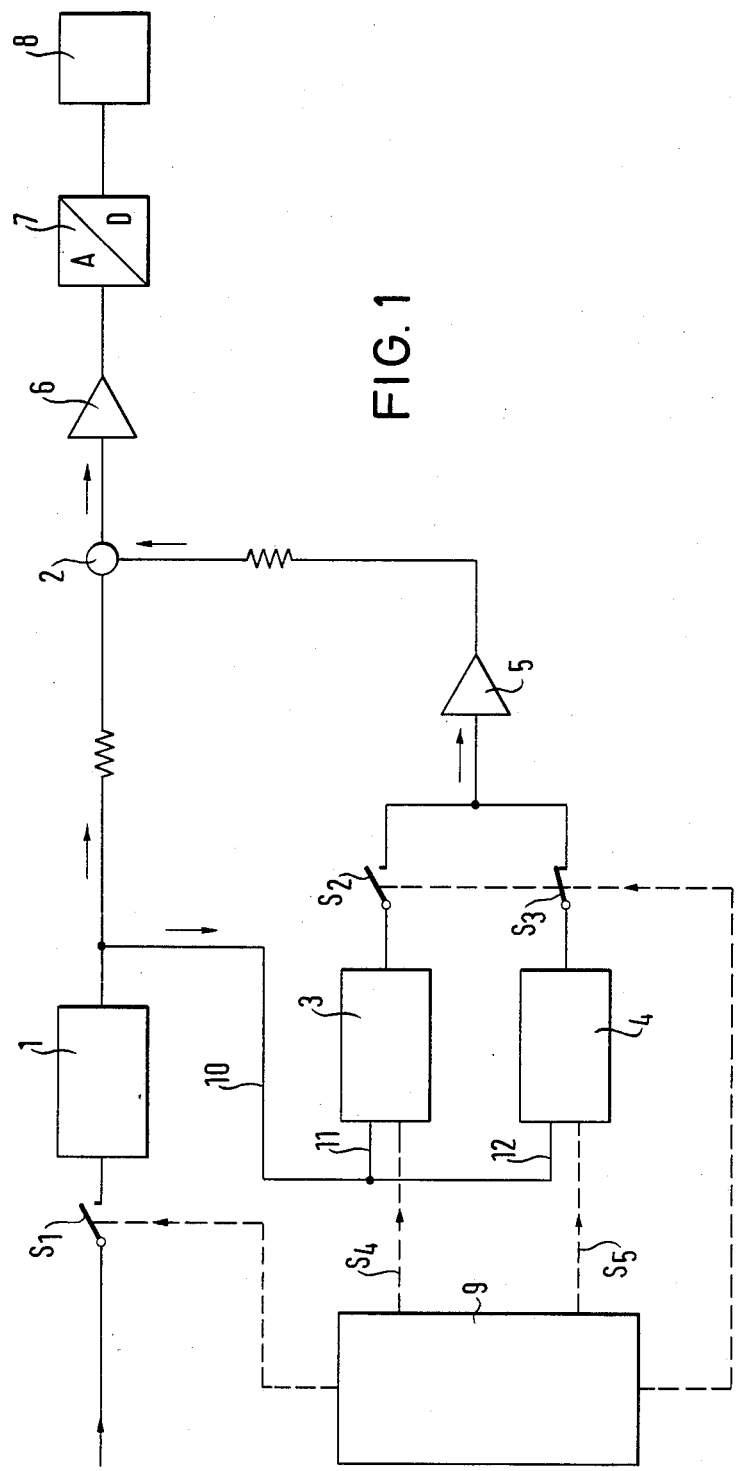
FIG. 1 is a block circuit diagram of the amplifier of the invention.

As shown in FIG. 1, the noisy measurement signal is fed through a switch $S_1$ to a first switch-controlled analog memory 1 where the signal can be stored so that on one hand it can be applied to the addition node 2 and on the other hand to two further switch-controlled analog memories (sample & hold) 3 and 4. From the latter the measurement signal is fed through switches $S_2$ and $S_3$ alternatingly to an inverter 5, one of these two switches always being open while the other always is closed. Thereby the signals from the two analog memories 3 and 4 link up immediately. In turn the inverter 5 feeds the addition node 2 so that the signals from the analog memory 1 will be combined with those from the inverter at that node.

Because the signal from the inverter is just as noisy as the previous measurement signal from which it was ascertained and is approximately as noisy as the present signal, a combination of two consecutive signals of the same polarity takes place at the addition node 2, where these signals differ by the difference in consecutive signals. Because of the opposite signs of the signals that follow, the measurement signal is always kept symmetrical relative to null. Hence the noise is compensated thereby. Essentially therefore only the measurement signal rid of the spurious voltage is transmitted and can be fed through an amplifier 6 to an analog-digital converter 7 and from it to a computer 8. As now a measurement signal rid of the spurious voltage is present, a high-resolution analog-digital converter is not required, instead a comparatively economical analog-digital converter with ordinary resolution may be used.

A clock or timer 9 is provided to drive in common the appropriately linked switches $S_1$ and $S_2$, and this timer can be operated on line frequency. The timing intervals are in the millisecond range.

By means of the connections denoted by $S_4$ and $S_5$ in FIG. 1, the timer 9 drives the analog memories 3 and 4 to limit the storage time.

The described circuitry operates as follows:

By means of switch $S_1$, the measured signal is fed to the first analog memory 1 and from it to the addition node 2. If the measured signal is negative (ie pointing toward minus) then the analog memory 4 is driven through the connections 10,12 wherein the particular previous positive signal (ie directed toward plus) is stored. This positive measured signal is fed through the closed switch $S_3$ to the inverter 5 which inverts it so that hereafter it can be combined as a negative signal with signal coming from the analog memory 1.

Correspondingly if the measured signal is positive, the previous negative measured signal is stored in memory 3 and fed through the switch $S_2$ to the inverter 5 where it is then inverted.

Figure 2:
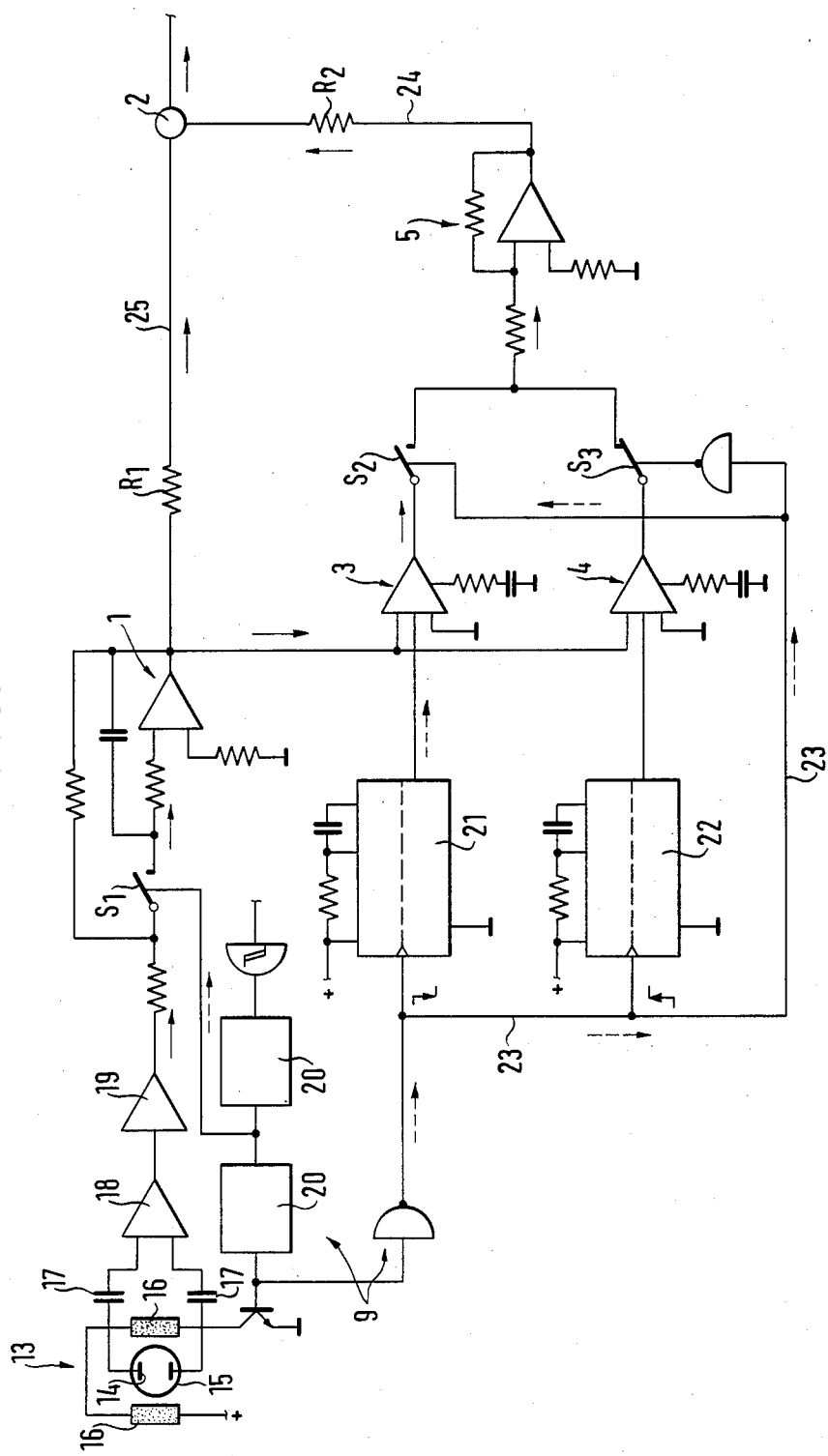
FIG. 2 is a block circuit diagram of FIG. 1 with further details.

FIG. 2 shows the block circuit diagram of FIG. 1 with additional details. It shows a primary pickup 13 of a flowmeter wherein a flow pipe 15 equipped with electrodes 14 is located inside timed magnetic fields generated by magnets 16, the measured signals so generated being fed through capacitors 17, the amplifiers 18 and 19 and from these through the switch $S_1$ to the first analog memory 1.

The switch $S_1$ is driven by the timer 9 comprising dividers 20 and of which the frequency depends on the line frequency. Together with the first amplifier 18 the capacitors 17 form a boot-strap circuit.

In the embodiment shown in FIG. 2, monostable vibrator stages 21 and 22 are inserted between the the timer 9 and the second and third analog memories 3 and 4, and control the storage times. The switches $S_2$ and $S_3$ of these memories 3 and 4 are driven in the described manner through the connection 23.

Adding-resistors $R_1$ and $R_2$ are mounted in the connections 24 and 25 between the inverter 5 and the addition node 2 on one hand and the first analog memory 1 and the addition node 2 on the other, in order to reduce the signal amplitudes and to avoid shorting.

We claim:

1. An amplifier of timed electrical measured signals incurring a relatively high spurious DC voltage and fed to an analog-digital converter, having consecutive measured signals of opposite signs and loaded with said spurious DC voltage each being combined with a signal obtained from a particular previous measured signal and inverted relative to it generating a superposed spurious voltage, a switch-controlled analog memory is provided to store a noisy measured signal which on one hand is fed to an addition node and on the other hand is fed to two switch-controlled analog memories from which it is alternatingly fed as a positive or negative signal relative to said superposed spurious voltage to an inverter in turn feeding said addition node.

2. The amplifier of claim 1, wherein said analog memories have switches driven by a common timer, all said switches linked together in time.

3. The amplifier of claim 2 having first, second and third analog memories wherein said switches of said second and third memories are coupled together so that one switch shall be open when the other is closed.

4. The amplifier of claim 3, wherein said timer is driven by a line frequency.

5. The amplifier of claim 4, wherein said timer has dividers inserted.

6. The amplifier of claim 4, wherein said switches are semiconductors.

7. The amplifier of claim 6, wherein monostable vibrator stages are mounted between said timer and the second and third analog memories and control storage times by time-limited pulses.

8. The amplifier of claim 7 having a measured signal pickup associated with a circuit of capacitors connected therebefore.

* * * * *